United States Patent [19]

Okamoto

[11] Patent Number: 4,562,924

[45] Date of Patent: Jan. 7, 1986

[54] FLAT PACKAGE INTEGRATED CIRCUIT CHIP STORING APPARATUS

[75] Inventor: Arata Okamoto, Akigawa, Japan

[73] Assignee: Kabushiki Kaisha Toshiba, Kawasaki, Japan

[21] Appl. No.: 663,952

[22] Filed: Oct. 23, 1984

[30] Foreign Application Priority Data

Oct. 26, 1983 [JP] Japan ............................ 58-200221

[51] Int. Cl.⁴ .............................................. B65D 73/02
[52] U.S. Cl. .................................. 206/330; 206/460; 206/332
[58] Field of Search .............. 206/460, 328, 330, 332

[56] References Cited

U.S. PATENT DOCUMENTS

| | | | |
|---|---|---|---|
| 4,298,120 | 11/1981 | Kaneko et al. | 206/460 |
| 4,406,367 | 9/1983 | Bouwknegt | 206/460 |
| 4,411,362 | 10/1983 | Itemadani et al. | 206/460 |
| 4,489,487 | 12/1984 | Bura | 206/460 |

*Primary Examiner*—Joseph Man-Fu Moy
*Attorney, Agent, or Firm*—Cushman, Darby and Cushman

[57] ABSTRACT

An apparatus for carrying flat package integrated chips disposed in chip carriers has backing paper with a plurality of holes evenly spaced along the left and right sides of the paper and extending in a length-wise direction of the paper. At least one adhesive tape is attached to one face of the backing paper and holds the chip carriers. A plurality of chip carriers are adhered to the adhesive tape and are uniformly spaced along the paper in the length-wise direction. Each carrier has first and second alignment holes which are aligned with the holes in the backing paper.

6 Claims, 16 Drawing Figures

FLAT PACKAGE INTEGRATED CIRCUIT CHIP STORING APPARATUS

BACKGROUND OF THE INVENTION

The present invention relates to a flat package integrated circuit (IC) chip storing apparatus which is suitable for storing a plurality of flat package IC chips.

A tray having many compartments as shown in FIG. 2 is generally used as a means for storing a plurality of flat package IC chips as shown in FIGS. 1A through 1C. Furthermore, a carrier for protecting leads of the flat package IC chip is also used. Such carriers are stored in a prism-shaped plastic case, a so-called "stick", as shown in FIG. 4.

However, these storing means have the following defects:

(i) Only a small number of chips can be stored. In other words, the number of chips which can be supplied is small. For this reason, when a reception test of chips or chip mounting to a printed circuit board is automatically performed, it takes considerable time to replace trays or sticks. When a machine for automatic replacing trays or sticks is adopted, this machine becomes complex in structure.

(ii) Furthermore, since chip alignment required for automatically mounting the chips becomes complex in procedure, a machine for automatically mounting IC chips becomes expensive. In a stick method, each of the carriers stored in the stick has aligning sections 11 (FIG. 3) and stoppers 12 comprising leaf springs to securely hold an IC chip. Therefore, the chip alignment becomes relatively easy in comparison to a tray method. However, since a carrier position in the stick and the relationship between respective carriers are unstable, sufficient alignment cannot be performed.

(iii) Since the shape of the tray or the stick varies with every manufacturer and for every type thereof, it is therefore difficult to design an automatic machine.

SUMMARY OF THE INVENTION

It is an object of the present invention to provide a flat package IC chip storing apparatus in which a large number of flat package IC chips can be stored and can be automatically fed so that the alignment of chips necessary for automatic handling of chips can be simplified.

The above-mentioned object is achieved by providing apparatus for carrying flat package integrated chips disposed in chip carriers. The present invention includes backing paper having a plurality of holes disposed on the left and right sides of the backing paper and extending in a length-wise direction of the paper, at least one adhesive tape attached to one face of the backing paper for holding the chip carriers, and a plurality of chip carriers adhered to the adhesive tape and uniformly spaced along the paper in the length-wise direction. Each chip carrier has first and second alignment holes which are aligned with the backing paper holes.

According to the present invention, since a large number of flat package IC chips can be stored, they can be automatically fed. Furthermore, chip storing/conveying processes from a chip reception test to a chip mounting process can be simplified and standardized. In addition, alignment of chips required for automatic chip handling can also be simplified. As a result, an automatic apparatus for the chip reception test and chip mounting can be easily designed.

BRIEF DESCRIPTION OF THE DRAWINGS

Other objects and features of the present invention will be apparent from the following description taken in connection with the accompanying drawings, in which.

DETAILED DESCRIPTION OF THE PREFERRED EMBODIMENTS

Figure 5:
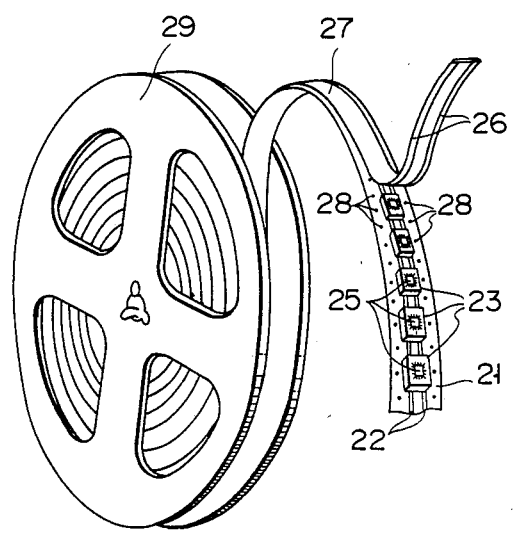
FIG. 5 is an overall perspective view of a flat package IC chip storing apparatus according to an embodiment of the present invention.
Figure 6:
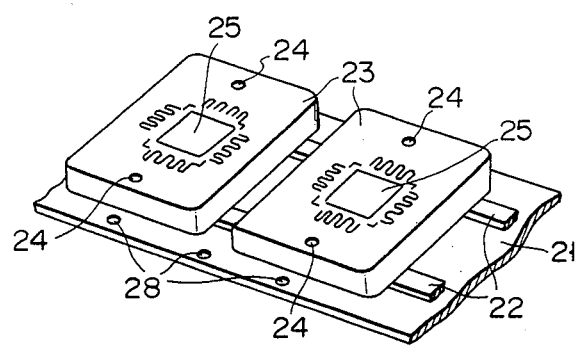
FIG. 6 is a perspective view of a main part of the overall perspective view shown in FIG. 5.

FIGS. 5 and 6 respectively show overall and partial views of a flat package IC chip storing apparatus according to an embodiment of the present invention. Two-side adhesive tapes 22 are adhered along the longitudinal direction of strip-shaped backing paper 21 at positions which are substantially symmetrical with respect to the central line of the paper 21. Flat package IC chip carriers (to be referred to as carriers for brevity hereafter) 23 are disposed on the backing paper 21 through the adhesive tapes 22 along the longitudinal direction of the paper 21 so as to be spaced apart by the same distance. In this case, the position of each of the carriers 23 along the transverse direction of the paper 21 is also kept the same. Aligning holes 24 for aligning the carrier 23 when it is used independently are formed at predetermined positions of each of the carriers 23. Flat package IC chips 25 which are respectively stored in the carriers 23 can be prevented from dropping from the carriers 23 by strip-shaped release paper 27 to which two-sided adhesive tapes 26 are adhered. The adhesive tapes 26 are adhered to two edges of the release paper 27 along the longitudinal direction thereof. Meanwhile, holes 28 are formed at a predetermined pitch in two edges of the backing paper 21 along the longitudinal direction thereof. As clearly depicted in FIG. 6, holes 28 are aligned with carrier aligning holes 24. These holes 28 are engaged with sprockets of a conveying mechanism for conveying the backing paper 21. The backing paper 21 having the carriers 23 thereon and the release paper 27 are integrally wound around a supply reel 29.

Figure 7:
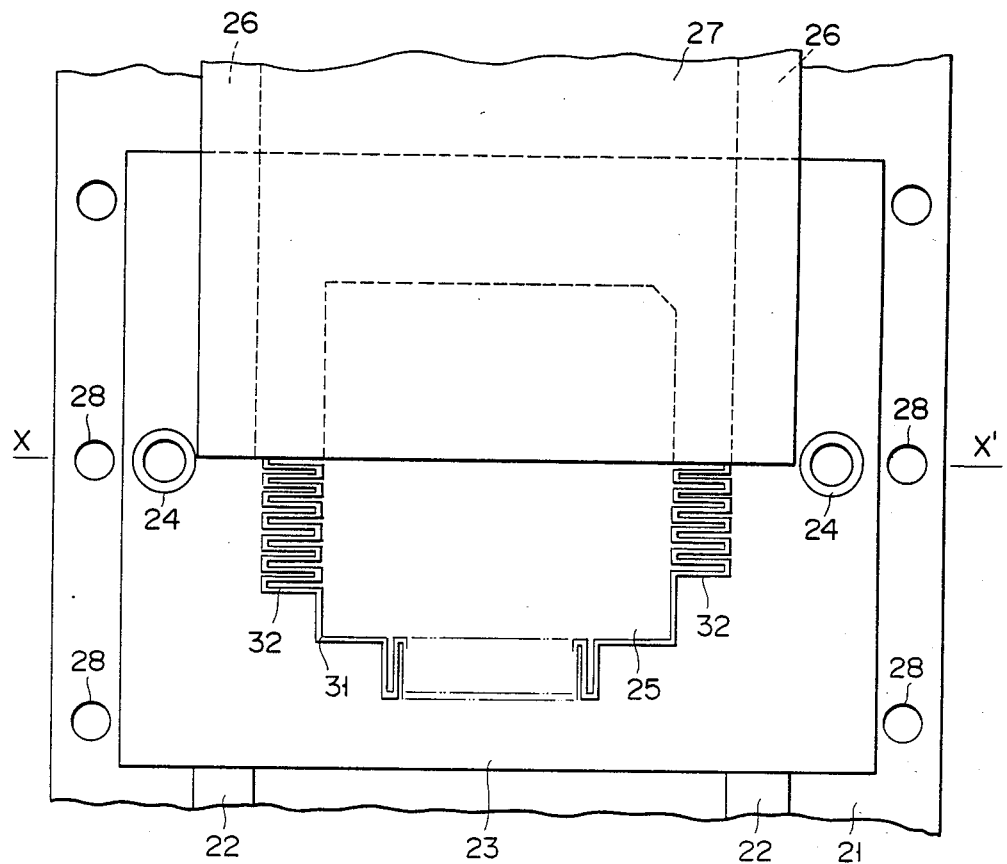
FIG. 7 is a plan view showing a storing state of flat package IC chips.
Figure 8:
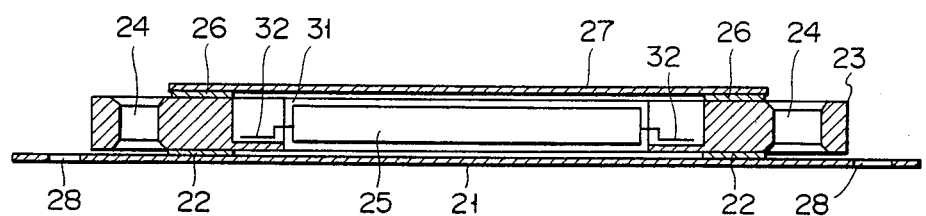
FIG. 8 is a sectional view along a line X–X' in FIG. 7.

FIG. 7 is a plan view showing a storing state of the flat package IC chip 25 in the flat package IC chip storing apparatus shown in FIG. 5, and FIG. 8 is a sectional view along the line X–X' of FIG. 7. As is apparent from FIGS. 7 and 8, the chip 25 is stored in a chip holder 31 which is formed in a substantially central portion of the carrier 23. The chip holder 31 is formed hollow so that the holder section thereof coincides with a shape of the chip 25 including leads 32. Therefore, when the chip 25 is mounted in the chip holder 31 of the carrier 23, the chip 25 is securely held by the chip holder 31, thereby preventing undesirable bending of the leads 32. The two edges of the lower surface of the carrier 23 are fixed to the backing paper 21 by means of the adhesive tapes 22. Furthermore, the two edges of the upper surface of the carrier 23 are fixed to the release paper 27 by the adhesive tapes 26. Dropping out of the chip 25 stored in the carrier 23 is thereby prevented.

A reception test, e.g., an electrical characteristic test, and automatic mounting to a printed circuit board of the chips 25 stored in the flat package IC chip storing apparatus will be described hereafter. The reel 29 is set on a supply reel table of a predetermined conveying mechanism, and a leading edge of the backing paper 21 is wound around a take-up reel which is set on a take-up reel table of the conveying mechanism. Furthermore, the holes 28 of the backing paper 21 are engaged with the sprockets of the conveying mechanism (neither are shown). Then, the sprockets are rotated at a constant speed in a manner such that a constant tension is given to the backing paper 21, thereby feeding the backing paper 21 at a constant pitch. In this case, the release paper 27 is released from the carrier 23 which is adhered to the backing paper 21. As described above, the carriers 23 are adhered to the backing paper 21 at equal intervals. Therefore, when the backing paper 21 is fed at a constant pitch, a carrier 23 can always be set at a predetermined position. As a result, the reception test of the chip 25 can be performed in the state wherein the carrier 23 is adhered to the backing paper 21, and the chip 25 is stored in the carrier 23. According to this embodiment, the carrier 23 is always positioned at the predetermined position, and alignment by the aligning holes 24 can be easily performed.

When the carrier 23 is aligned, the position of the chip 25 is automatically determined and a measuring probe can be easily brought into contact with the respective leads 32 of the chip 25. The backing paper 21 having the carrier 23 which has been subjected to the reception test is taken up by the take-up reel upon rotation thereof. In this case, the backing paper 21 having the carrier 23 is taken up, while new release paper 27 is overlapped on the carrier 23.

Next, automatic mounting of IC chips 25 to a printed circuit board or the like will be described. The feeding process of the backing paper 21 is the same as that of the reception test and a detailed description thereof is omitted. Either of the following two methods is adopted for picking up the chip 25 in the automatic mounting machine.

Figure 9A:
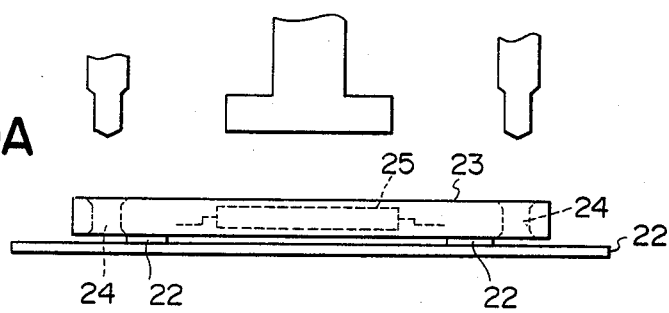
FIGS. 9A through 9D are respectively views for explaining automatic mounting processes for mounting on a printed circuit board using the flat package IC chip according to the present invention.
Figure 9B:
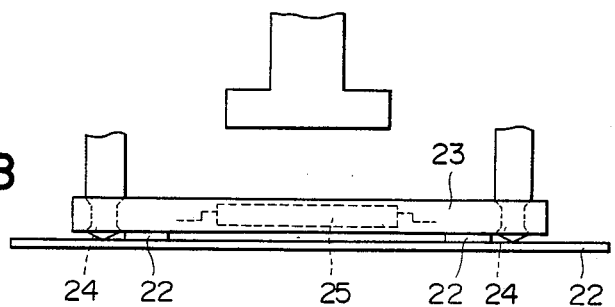
Figure 9C:
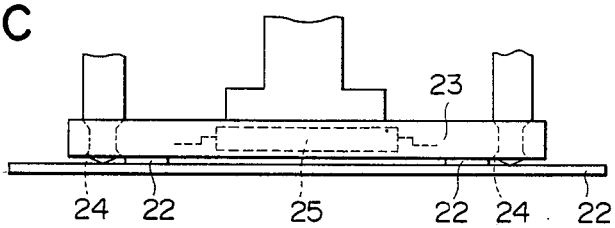
Figure 9D:
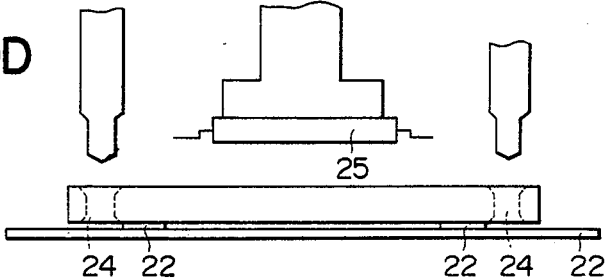

First, the carrier 23 is aligned by the aligning holes 24 thereof. In this state, the chip 25 is picked up from the carrier 23 and is supplied to an automatic mounting machine. Some steps of a mounting process according to the first method are shown in FIGS. 9A through 9D. FIG. 9A shows the state wherein the release paper 27 is released. Then, as shown in FIG. 9B, the carrier 23 is aligned using the aligning holes 24. Thereafter, as shown in FIGS. 9C and 9D, the chip 25 is picked up by vacuum suction or the like and is mounted at a target position of a printed circuit board (not shown).

Second, the carrier 23 is released from the backing paper 21 and is fed to the automatic mounting machine. In this second method, alignment of the chip 25 depends upon the automatic mounting machine. If either the first or second method is used, the carrier 23 is always kept at the predetermined position and the position of the chip 25 with respect to the carrier 23 is constant. For this reason, alignment of the chip 25 can be easily performed. It should be noted that the aligning holes 24 of the carrier 23 are tapered, thereby simplifying carrier alignment. When the carrier 23 is positioned on the backing paper 21, no high-precision control is required.

In this embodiment, when the carrier 23 is placed on the paper 21, the supply reel, around which the backing paper 21 having the adhesive tapes 22 is wound, is used. This supply reel is set on the supply reel table of the predetermined conveying mechanism, and the leading edge of the backing paper 21 is wound around the reel 29 which is set on the take-up reel table of the conveying mechanism. Furthermore, the holes 28 of the backing paper 21 are engaged with the sprockets of the conveying mechanism. The sprockets are rotated at a constant speed to apply a constant tension on the backing paper 21, thereby feeding the backing paper 21 at a constant pitch. In correspondence with this supply operation, the carriers 23 are disposed on the backing paper 21. In addition, in correspondence with this supply operation, the reel 29 is rotated. Then, the backing paper 21 to which the carriers 23 are adhered and spaced apart by the same distance is wound around the reel 29. In this case, the backing paper 21 having the carriers 23 is taken up while the release paper 27 having the adhesive tapes 26 is overlapped on the carriers 23, thereby obtaining the storing apparatus shown in FIG. 5.

Figure 1A:
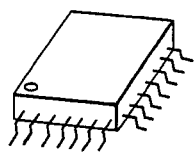
FIGS. 1A through 1C are perspective views showing various flat package IC chips.
Figure 1B:
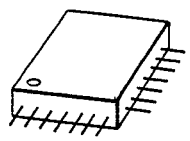
Figure 1C:
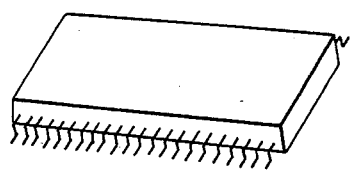
Figure 2:
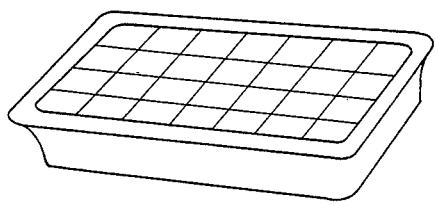
FIG. 2 is a perspective view showing a chip storing tray.
Figure 3:
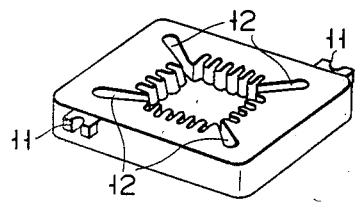
FIG. 3 is a perspective view showing a flat package IC chip carrier.
Figure 4:
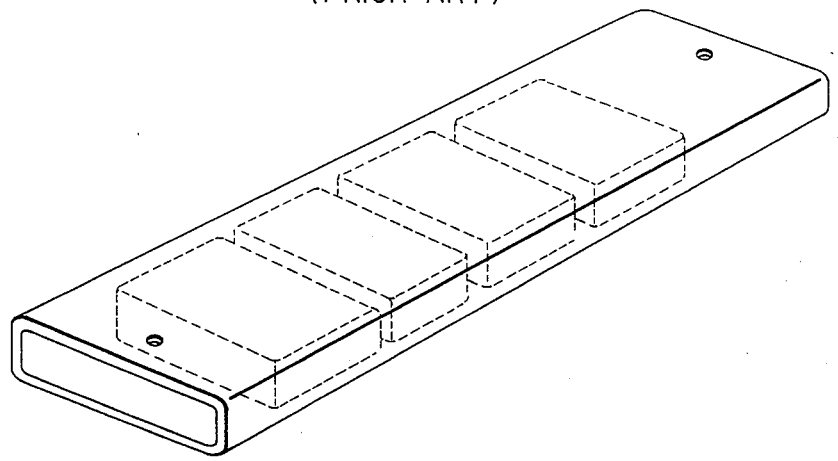
FIG. 4 is a perspective view showing a stick for storing carriers shown in FIG. 3.

In the above embodiment, the adhesive tapes 26 are used to prevent the chip 25 from dropping out of the carrier 23. However, when the carrier (FIG. 3) having stoppers which prevent movement of the stored chip is used, the release paper 27 is omitted. When the feeding speed of the backing paper 21 is constantly maintained by using only a rotating mechanism of the take-up reel for the backing paper 21, the holes 28 need not be formed. Furthermore, the reel 29 is not always needed for the flat package IC chip storing apparatus, and can be used for only the conveying operation.

Figure 10:
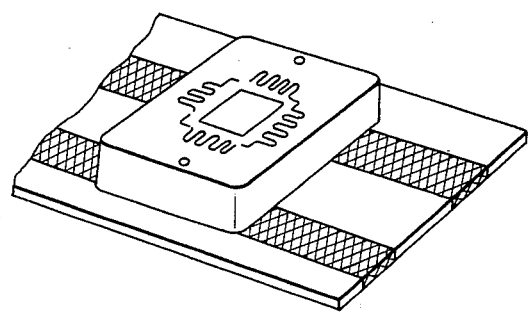
FIGS. 10 and 11 are respectively perspective views showing a flat package IC chip storing apparatus according to another embodiment of the present invention.

In the above embodiment, the adhesive tapes 22 are adhered to the backing paper 21. However, as shown in FIG. 10, when backing paper which has adhesive portions at adhering positions of the adhesive tapes 22 is used, the adhesive tapes 22 can be omitted.

Figure 11:
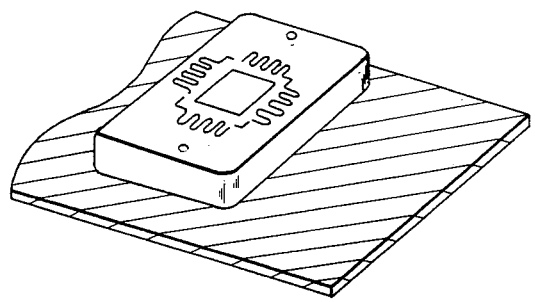

As shown in FIG. 11, an overall surface of the backing paper 21 can have adhesiveness. Furthermore, adhesive portions can be provided on the carrier.

What is claimed is:

1. Apparatus for carrying flat package integrated chips disposed in chip carriers, comprising:
   backing paper having first and second faces and left and right sides, a plurality of holes being disposed in said paper on said left and right sides and extending in a lengthwise direction of said paper;
   at least one adhesive tape connected to said backing paper first face, for holding said carriers; and
   a plurality of chip carriers adhered to said adhesive tape and uniformly spaced along said paper lengthwise direction, each said chip carrier having first and second alignment holes which are aligned with said backing paper holes.

2. An apparatus according to claim 1, further comprising release paper for covering said flat package integrated circuit chip carriers.

3. An apparatus according to claim 2, further including two two-sided adhesive tapes adhered respectively to two edges of said release paper along a longitudinal direction thereof and facing said backing paper first face.

4. An apparatus according to claim 2, further including a reel, said backing paper and said release paper being integrally wound around said reel.

5. An apparatus according in claim 1, wherein each of said plurality of carriers is at a constant position along a transverse direction of said backing paper.

6. Apparatus according to claim 1 wherein said at least one adhesive tape includes two adhesive tapes extending in said lengthwise direction and symmetrical with respect to a centerline of said backing paper, each of said adhesive tapes having adhesive of both sides for adhering to said backing paper and to said chip carriers.

* * * * *